United States Patent
Wada et al.

(10) Patent No.: US 7,106,649 B2
(45) Date of Patent: Sep. 12, 2006

(54) SEMICONDUCTOR MEMORY DEVICE

(75) Inventors: Osamu Wada, Yokohama (JP); Toshimasa Namekawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/022,786

(22) Filed: Dec. 28, 2004

(65) Prior Publication Data

US 2006/0044924 A1 Mar. 2, 2006

(30) Foreign Application Priority Data

Sep. 2, 2004 (JP) ............................. 2004-255831

(51) Int. Cl.
*G11C 8/00* (2006.01)
(52) U.S. Cl. ............................. 365/230.06; 365/230.03
(58) Field of Classification Search ...................... None
See application file for complete search history.

(56) References Cited

U.S. PATENT DOCUMENTS 6,067,257 A * 5/2000 Kitsukawa et al. .... 365/189.11
6,195,305 B1 * 2/2001 Fujisawa et al. ............ 365/226
6,229,755 B1    5/2001 Oh
6,274,895 B1 * 8/2001 Fujii et al. .................. 257/207
6,584,031 B1 * 6/2003 Fujisawa et al. ............ 365/226

OTHER PUBLICATIONS

Tohru Kimura, et al., "64Mb 6.8ns Random ROW Access DRAM Macro for ASICs", IEEE International Solid-State Circuits Conference, 1999, Session 24, Paper WP 24.4 p. 416-417.

* cited by examiner

*Primary Examiner*—Thong Q. Le
(74) *Attorney, Agent, or Firm*—Oblon, Spivak, McClelland, Maier & Neustadt, P.C.

(57) ABSTRACT

A semiconductor memory device includes a memory cell array comprising a plurality of memory sub-array blocks arranged in a row direction, a plurality of sub-word lines which extend in the row direction to connect with the plurality of memory cells, a plurality of sub-word-line drivers, a plurality of sub-word-line level shifters, a first pre-decoded line group which is connected with the respective sub-word-line drivers, a second pre-decoded line group which extends across the memory sub-array block in the row direction and is connected with the sub-word-line level shifters, and a pre-row-decoder which supplies information of a selected cell to the first and second pre-decoded lines.

18 Claims, 5 Drawing Sheets

SEMICONDUCTOR MEMORY DEVICE

CROSS-REFERENCE TO RELATED APPLICATIONS

This application is based upon and claims the benefit of priority from prior Japanese Patent Application No. 2004-255831, filed Sep. 2, 2004, the entire contents of which are incorporated herein by reference.

BACKGROUND OF THE INVENTION

1. Field of the Invention

The present invention relates to a semiconductor memory device, and more particularly to a semiconductor memory device having a hierarchical word-line scheme comprising main word-lines and sub-word-lines.

2. Description of the Related Art

Although high integration of a semiconductor memory device, especially, a DRAM has rapidly advanced in recent years, a reduction in word-line rising speed due to an increase in load capacitance at word-line rising involved due to an increase in memory capacity and an increase in current consumption have become a problem.

In general, a word-line rising time is dependent on a wiring resistance of word-lines, a wiring resistance of a load capacitance and a word-line driving current supply circuit, and a load capacitance. For example, in Jpn. Pat. Appln. KOKAI Publication No. 7-130168, a split decode scheme by which a word-line is divided into a plurality of lines and a current supply word-line driver is provided for each of the divided word-lines is adopted in order to increase the word-line driving speed, and a word-line driving current is supplied to word-line drivers in the same column through at least two signal lines. With such a configuration, since the number of word-line drivers per word-line driving current supply signal is reduced, i.e., since a load capacitance of the word-line driving current supply circuit is reduced, a rising speed of the word-lines is increased, thereby reducing current consumption when driving the word-lines.

Further, as means for reducing a resistance by substantially shortening a word-line length, there is known a DRAM adopting a hierarchical word-line scheme in which one main word-line is divided into a plurality of sub-word-lines and a sub-word-line driver is provided for each of the divided sub-word-lines. More specifically, this is a scheme in which a memory cell array is divided into a plurality of sub-arrays in a word-line direction, a plurality of main word-lines branch out in accordance with each sub-array, and a sub-word-line driver which receives an address signal through the main word-line which is provided for and corresponds to each sub-array selectively drives a plurality of associated sub-word-lines. A driver which drives the sub-word-lines upon receiving addresses from the main word-lines is disclosed in, e.g., U.S. Pat. No. 6,229,755B1, and is a driver which supplies boosted address signals to the sub-word-lines based on address signals of the main word-lines activated by a boosted potential VPP.

In the above-described hierarchical word-line scheme, since the main word-lines branch out to the plurality of sub-word-lines and a desired sub-word-line is selectively driven, the resistance of the word-lines can be reduced, and the word-line selection operation speed can be thereby increased. In such a hierarchical word-line scheme, however, a boosted potential VPP must be supplied to a related driver in order to activate an arbitrary word-line. Consequently, in the case of a semiconductor memory device comprising a boosted potential (VPP) generator or a decoupling capacitor which stabilizes a boosted potential as an internal circuit, a layout area of a charge-pump circuit or the decoupling capacitor constituting the boosted potential generator is increased, leading to an increase in a chip area.

In the semiconductor memory device adopting the hierarchical word-line scheme, therefore, there has been demanded a realization of a semiconductor memory device which can reduce power losses in main word-lines, and reduce the entire chip area by decreasing the area required for an internal boosted potential generator or decoupling capacitor.

BRIEF SUMMARY OF THE INVENTION

According to one aspect of the invention, there is provided a semiconductor memory device which comprises:

a memory cell array in which a plurality of memory cells are arranged in rows and columns and which comprises a plurality of memory sub-array blocks divided in a direction of the rows;

a plurality of sub-word lines which are provided in each of the plurality of memory sub-array blocks, and extend in the direction of the rows to connect with corresponding ones of the plurality of memory cells;

a plurality of sub-word-line drivers each of which is provided in each of the plurality of memory sub-array blocks and which drive the plurality of sub-word lines;

a plurality of sub-word-line level shifters each of which is provided in each of the plurality of memory sub-array blocks and which supply a boosted signal to the plurality of sub-word-line drivers;

a first pre-decoded line group which extends across the plurality of memory sub-array blocks in the direction of the rows, and is connected with the plurality of sub-word-line drivers;

a second pre-decoded line group which extends across the plurality of memory sub-array blocks in the direction of the rows, and is connected with the plurality of sub-word-line level shifters; and a pre-row-decoder which pre-decodes an address of a selected cell in the plurality of memory cells, and supplies information of a sub-word-line corresponding to a row address of the selected cell in the plurality of sub-word lines to the first pre-decoded line group and the second pre-decoded line group.

The semiconductor memory device of the invention can further comprise an internal boosted power supply generator which supplies a boosted potential to the sub-word-line drivers and the sub-word-line level shifters, and a decoupling capacitor which stabilizes the boosted potential.

DETAILED DESCRIPTION OF THE INVENTION

Figure 1:
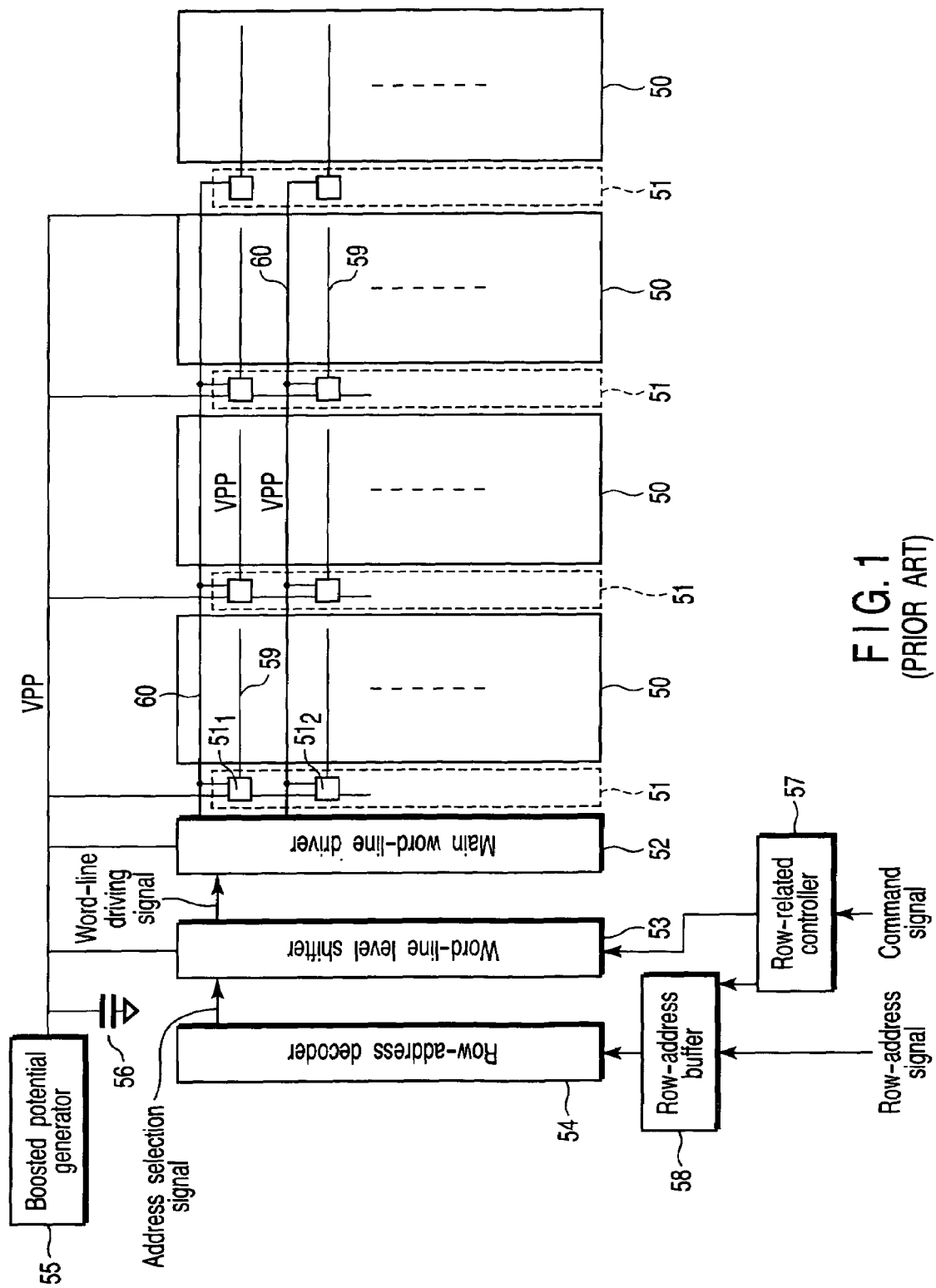
FIG. 1 is a schematic layout chart of a conventional semiconductor memory device adopting a hierarchical word-line scheme.

Before explaining an embodiment according to the present invention, a conventional hierarchical word-line scheme will be described in more detail. FIG. 1 is a block diagram schematically showing a configuration concerning a row operation of a conventional semiconductor memory device. This semiconductor memory device is constituted by a hierarchical word-line scheme using sub-word lines 59 and main word-lines 60, and its primary part comprises memory sub-array blocks 50 having a plurality of memory cells, sub-word-line drivers 51, a main word-line driver 52, a word-line level shifter 53 and a row-address decoder 54. In this example, a memory cell portion is divided into four memory sub-array blocks 50 in a row direction, and the plurality of (e.g., 512) main word-lines 60 are provided to cross these four memory sub-array blocks 50. The sub-word-lines 59 are provided for each memory sub-array block, and one main word-line 60 branches out to four sub-word-lines 59 in accordance with the four memory sub-array blocks in this example. The sub-word-line 59 is selectively driven by the sub-word-line driver 51 which has received a selection signal from a corresponding main word-line 60. It is to be noted that the sub-word-line driver 51 includes sub-drivers 511, 512, . . . for the respective main word-lines and collectively means a driver for each memory sub-array block.

Furthermore, the memory semiconductor device comprises a boosted potential generator 55 which supplies a boosted potential VPP to each sub-word-line driver 51, the main word-line driver 52 and the word-line level shifter 53, and a decoupling capacitor 56 which stabilizes the boosted potential. Moreover, memory core controllers such as a row-related controller 57 which controls each memory sub-array block 50 or the row-address decoder 54 or a row-address buffer 58 are also provided.

The row-address buffer 58 temporarily stores an input address signal, and supplies this signal to the row-address decoder 54. The row-related controller 57 generates a control command upon receiving a command signal such as a READ signal or a WRITE signal, and controls the entire row-related circuit.

The row-address decoder 54 generates an address selection signal which is used to select an arbitrary main word-line. The word-line level shifter 53 generates a word-line driving signal boosted to the boosted potential VPP upon receiving the address selection signal. The main word-line driver 52 drives an arbitrary main word-line 60 by using the word-line selection signal. A potential of the main-word lines 60 is also the boosted potential VPP. The sub-word-line driver 51 selectively drives the sub-word-lines 59 existing in each memory sub-array block 50 upon receiving the address signals from the main word-lines 60. The sub-word-line 59 also uses the boosted potential VPP.

An operation will now be briefly described. An external command signal and row-address signal are respectively input to the word-line level shifter 53 and the row-address decoder 54 through the row-related controller 57 and the address buffer 58. The row-address decoder 54 generates an address selection signal which is used to select an arbitrary main-word line based on the input row-address signal, and outputs a word-line driving signal boosted to the boosted potential VPP by the word-line level shifter 53. The main word-line driver 52 activates the main word-line upon receiving the word-line driving signal. The main word-line 60 is input to each sub-word-line driver 51, and activates a predetermined sub-word-line 59 provided in each memory sub-array block 50.

In such a hierarchical word-line scheme, the word-lines are divided based on the main word-lines and the sub-word-lines. As a result, a resistance of the main word-lines can be substantially reduced, and an increase in speed of the word-line selection operation can be realized. In such a hierarchical word-line scheme, however, in order to activate an arbitrary word-line, the boosted potential VPP must be supplied to the word-line level shifter 53, the main word-line driver 52 or the sub-word-line driver 51. In the case of the semiconductor memory device comprising the boosted potential generator 55 or the decoupling capacitor 56 as the internal circuits, a layout area of a non-illustrated charge-pump circuit or the decoupling capacitor 56 in the boosted potential generator 55 is disadvantageously increased, which results in an increase in chip area. The following embodiment according to the present invention provides a semiconductor memory device adopting a hierarchical word-line scheme which solves the above-described problem.

Figure 2:
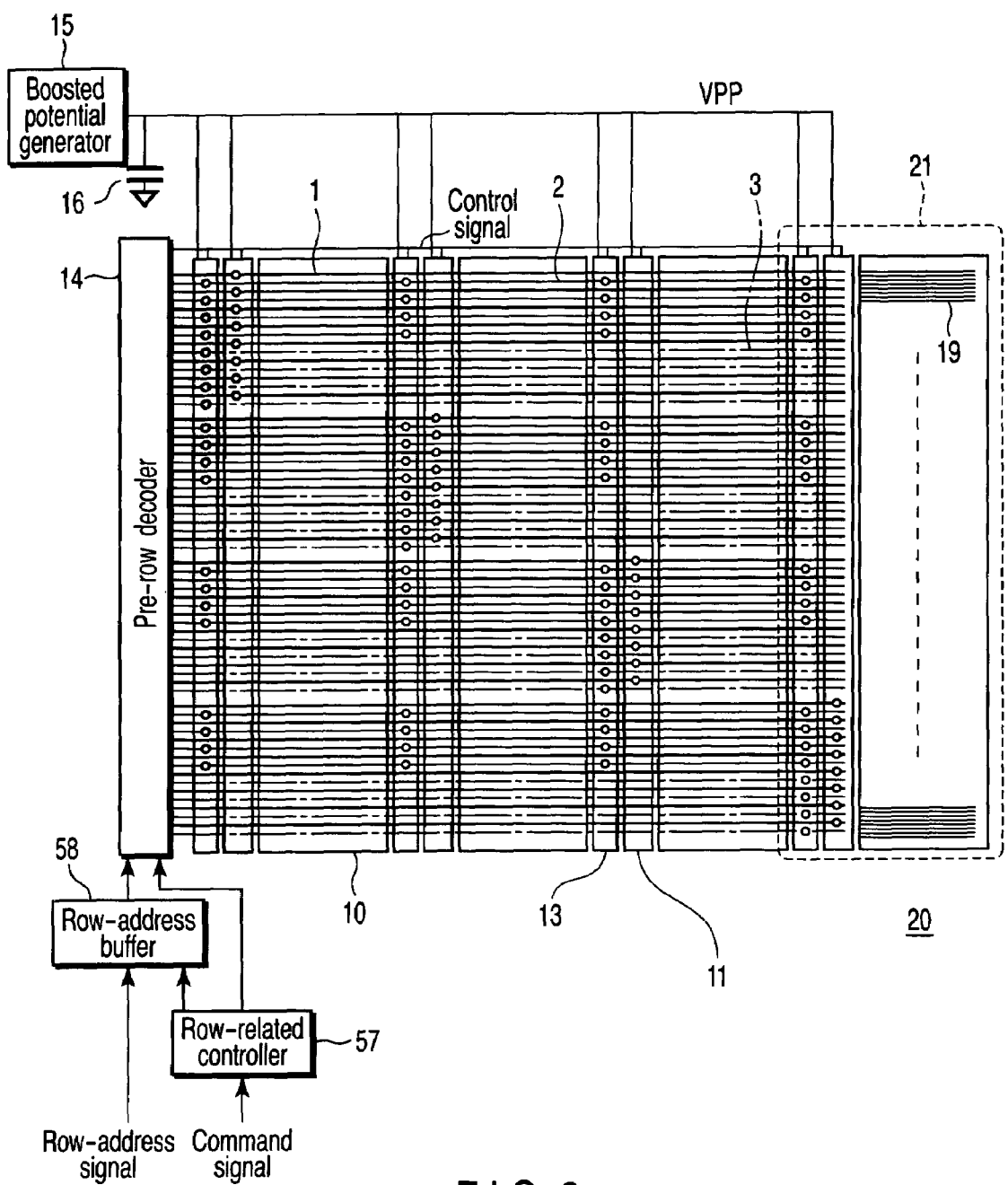
FIG. 2 is a schematic layout chart showing a configuration of a semiconductor memory device according to an embodiment of the present invention.
Figure 3:
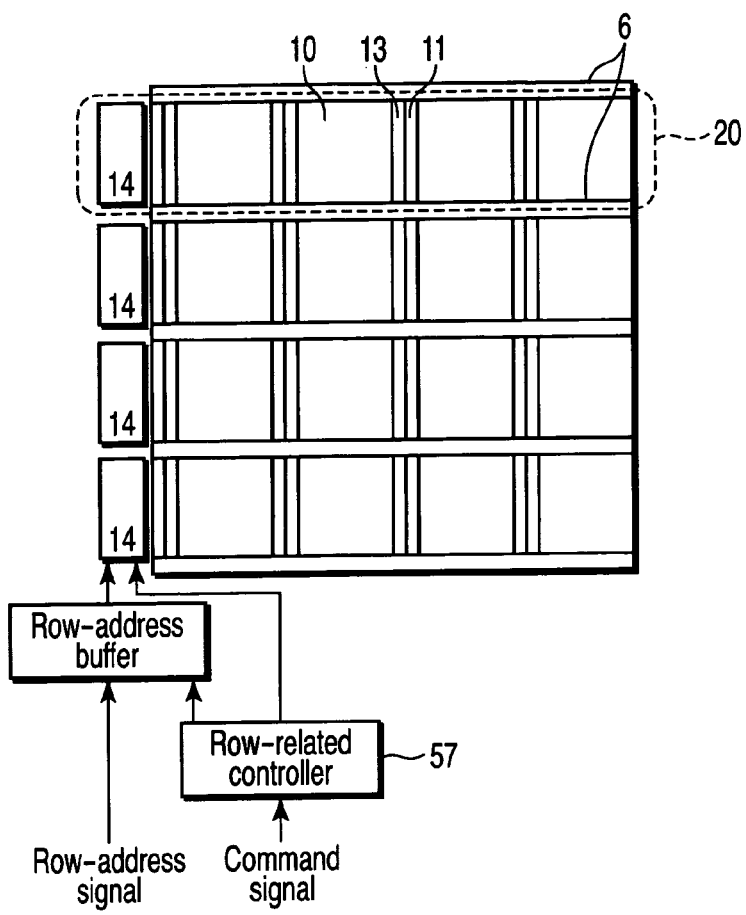
FIG. 3 is a macro layout chart of the semiconductor memory device according to the embodiment of the present invention, and an uppermost stage is shown in detail in FIG. 1.
Figure 4:
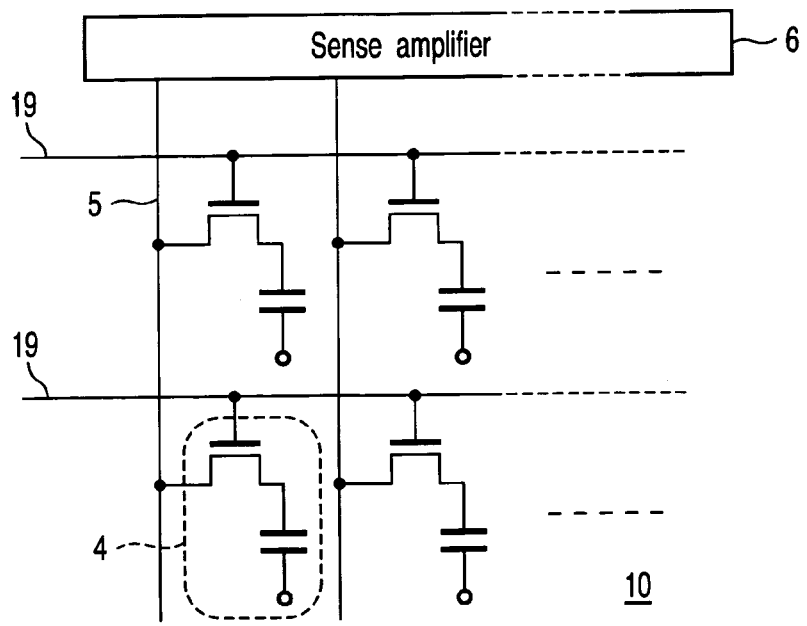
FIG. 4 is a schematic circuit diagram showing wire connections in a memory cell array block.

FIG. 2 is a block diagram schematically showing a part of a semiconductor memory device according to an embodiment of the present invention, in which an uppermost stage in the entire layout chart depicted in FIG. 3 is enlarged. It is to be noted that a sense amplifier portion shown in FIG. 3 is eliminated in FIG. 2. Additionally, FIG. 4 is a view showing internal wire connections in a memory sub-array block 10 depicted in FIG. 3, and schematically illustrates wire connections between memory cells 4, word-lines 19, bit-lines 5 and a sense amplifier portion 6.

The semiconductor memory device shown in FIG. 2 has a configuration in which a plurality of sub-macros 21 each comprising a memory sub-array block 10 having a plurality of memory cells 4 (not shown), a sub-word-line driver 11 and a sub-word-line level shifter 13 are arranged in a row direction and address selection signals are supplied to these sub-macros 21 from a pre-row-decoder 14. Further, this semiconductor memory device has first pre-decoded lines 1, and second pre-decoded lines (XB)2 and (XA) 3 extending in the row direction like the conventional main word-lines. These pre-decoded lines will be described later. Furthermore, although a plurality of sub-word-lines 19 driven by the sub-word-line driver 11 are arranged in each memory sub-array block 10, they are shown in the sub-macro 21 at the right end only in order to avoid complication of the drawing.

Moreover, a boosted potential generator 15 which supplies a boosted voltage VPP to the sub-word-line driver 11 and the sub-word-line level shifter 13 and a decoupling capacitor 16 which stabilizes a boosted potential are provided. Additionally, memory core controllers such as a row-related controller 57 or a low-address buffer 58 are also provided in order to control the memory sub-array blocks 10 or the pre-low-decoder 14.

The low-address buffer 58 temporarily stores an input row-address signal, and supplies this signal to the pre-low-decoder 14. The row-related controller 57 generates a control command upon receiving a command signal such as a READ signal or a WRITE signal, and controls the entire row-related circuit. The pre-low-decoder 14 activates the first pre-decoded line 1 and the second pre-decoded lines 2 and 3 in accordance with the control command output from the row-related controller and a selected address.

As shown in FIG. 2, the first pre-decoded lines (line group) 1 comprise, e.g., 32 lines, and eight first pre-decoded lines are supplied to each of the four memory sub-array blocks 10. Although the 32 first pre-decoded lines 1 are provided, one line is selected out of eight lines. Assume the first pre-decoded lines <0:31>, four lines of 0, 8, 16 and 24 are activated when a given address is input, for example. Therefore, each one first pre-decoded line 1 is selected in each of the four memory sub-array blocks 10.

From the 32 first pre-decoded lines, each eight lines are selectively connected to the sub-word-line driver 11 attached to each memory sub-array block 10. The sub-word-line driver 11 shifts a level of a selected line only to the boosted potential VPP in the corresponding eight first pre-decoded lines.

There are two types of the second pre-decoded lines (line group) which supply signals XA and XB, and each type comprises, e.g., 16 lines in such a manner that they cut across each of the four memory sub-array blocks 10 in the row direction. The sub-word-line level shifter 13 attached to each memory sub-array block 10 receives pre-decoded signals XA and XB from the pre-row-decoder 14, and supplies to each sub-word-line driver 11 a signal which is used to select a word-line driver group subjected to level conversion to VPP.

Figure 5:
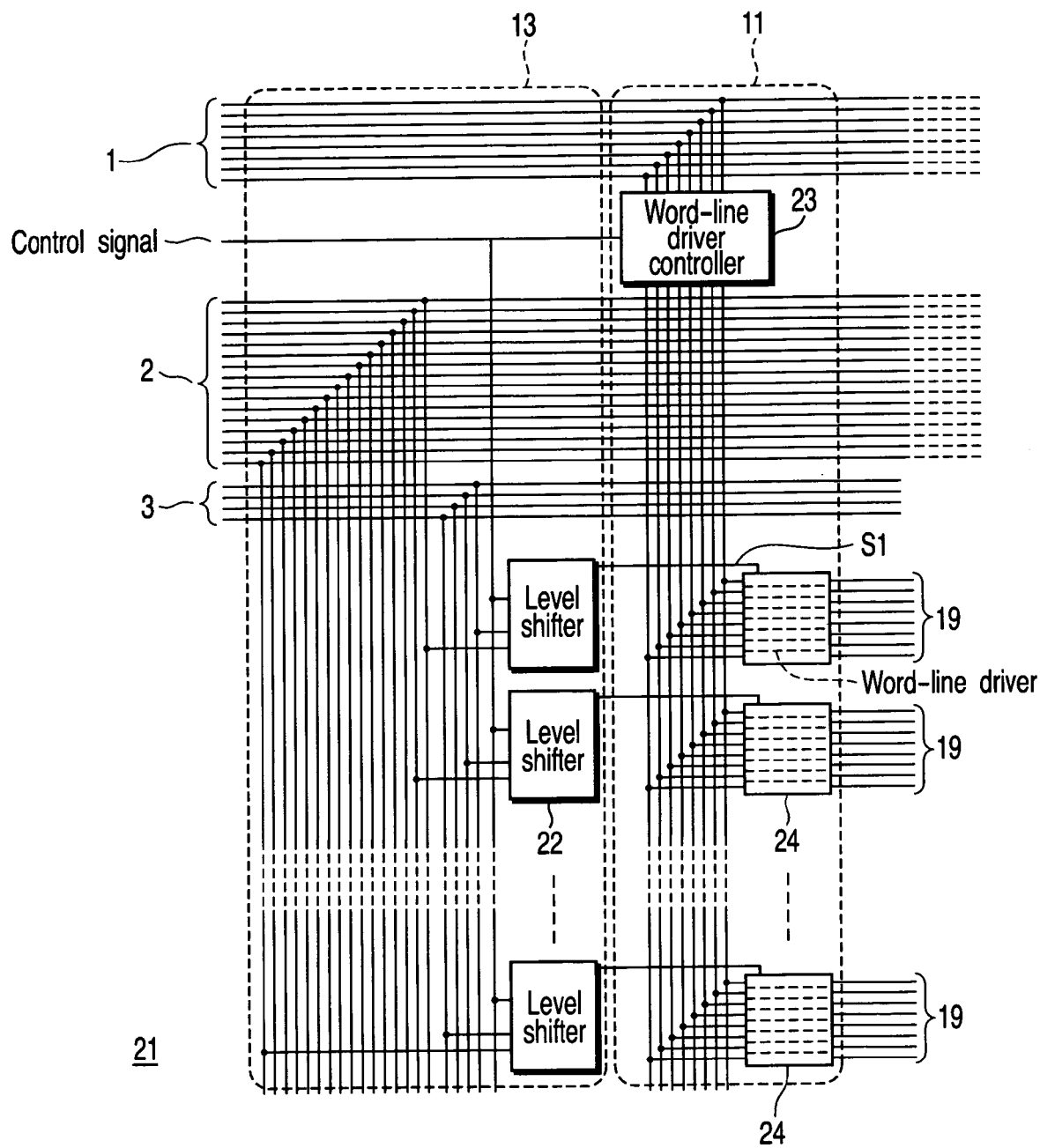
FIG. 5 is a block diagram showing connections between first and second pre-decoded lines, a sub-word-line level shifter and a sub-word-line driver.

In more detail, as shown in FIG. 5, a control signal is supplied from the pre-row-decoder 14 to each sub-word-line driver 11 and each sub-word-line level shifter 13. The sub-word-line level shifter 13 generates a selection signal s1 boosted to the boosted potential VPP based on the signals XA and XB of the second pre-decoded lines and the control signal, and the sub-word-line driver 11 receives this selection signal and the signal of the first pre-decoded line and drives the selected sub-word-line in the memory sub-array block 10. A potential of the sub-word-line is the boosted potential VPP.

As a line which carries the signal XA (reference numeral 3) among the second pre-decoded lines, one out of four lines is selected. Assume XA <0:15>, lines XA <0, 4, 8, 12> are selected, for example. In FIG. 5, however, the first four lines only in the second pre-decoded lines (XA) are shown.

There are 16 lines which can carry the signal XB (reference numeral 2) in the second pre-decoded lines, and one out of these 16 lines is selected. Assuming XB <0:15>, a line XB <0> only or a line XB <1> only is selected, for example.

It is to be noted that each white circle in FIG. 2 indicates a contact between the second pre-decoded line and the sub-word-line level shifter 13 in each memory sub-array block. Further, the first pre-decoded lines, the second pre-decoded lines XA and XB and the sub-word-lines are all arranged in the same direction (the row direction).

As described above, by using the first pre-decoded lines and the second pre-decoded lines XA and XB, one sub-word-line can be selected from the 512 sub-word-lines in the selected sub-macro 21. That is, one sub-word-line 19 is selected from the selected sub-macro 21 by one access.

It is to be noted that the word-line level shifter 13 comprises a plurality of (64 in this example) unit level shifters 22, receives the signals of the second pre-decoded lines XA and XB and the control signal, and outputs a boosted selection signal S1 to the word-line driver group 24.

The sub-word-line driver 11 comprises a word-line driver controller 23 and a plurality of word-line driver groups 24 (64 as the driver groups each driving eight sub-word-lines in this example); The word-line driver controller 23 is a level shifter which converts the selection signal supplied from the first pre-decoded line into the boosted potential VPP. Furthermore, as the word-line driver group 24, each driver which drives, e.g., eight sub-word-lines 19 is arranged. The word-line driver group 24 activates one sub-word-line by using a boosted selection signal supplied from the word-line driver controller 23 and the selection signal s1 output from the level shifter 22.

Figure 6:
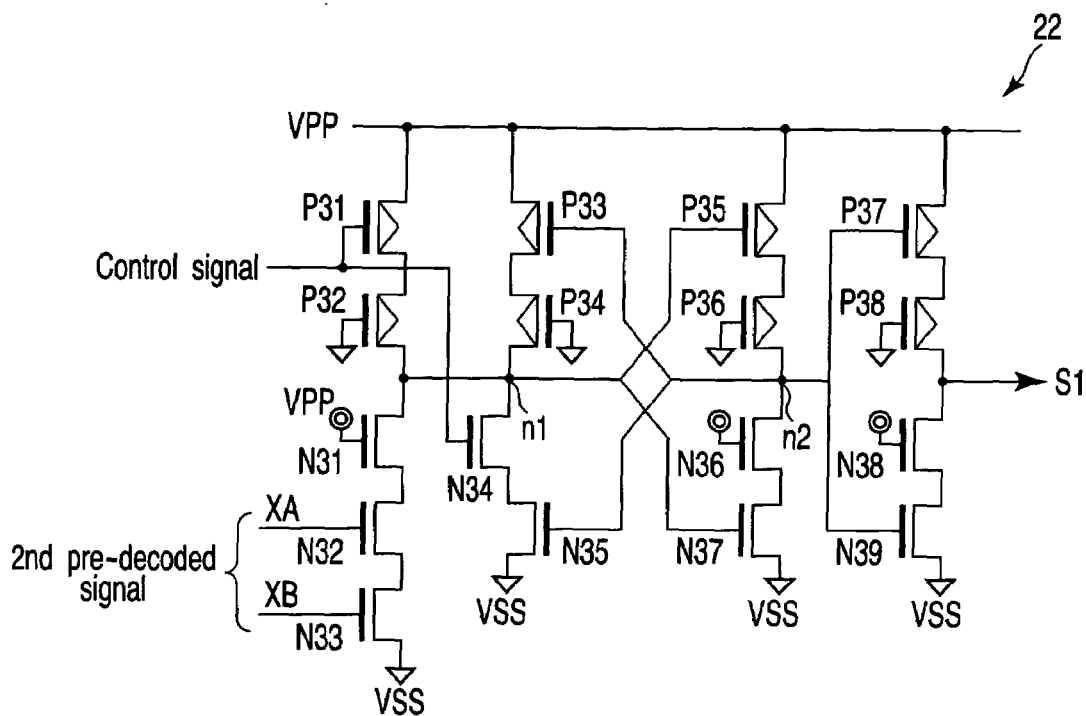
FIG. 6 is a circuit diagram of the sub-word-line level shifter.

FIG. 6 shows an example of a circuit diagram of each level shifter 22. In this level shifter 22, a drain of an N type MOS transistor (which will be referred to as an NMOS transistor hereinafter) N31 in NMOS transistors N31, N32 and N33 connected in series is connected with a drain of a P type MOS transistor (which will be referred to as a PMOS transistor hereinafter) P32 in PMOS transistors P31 and P32 connected in series.

Likewise, a drain of an NMOS transistor N34 in NMOS transistors N34 and N35 connected in series is connected with a drain of a PMOS transistor P34 in PMOS transistors P33 and P34 connected in series; a drain of an NMOS transistor N36 in NMOS transistors N36 and N37 connected in series is connected with a drain of a PMOS transistor P36 in PMOS transistors P35 and P36 connected in series; and a drain of an NMOS transistor N38 in NMOS transistors N38 and N39 connected in series is connected with a drain of a PMOS transistor P38 in PMOS transistors P37 and P38 connected in series.

A ground potential VSS is supplied to sources of the NMOS transistors N33, N35, N37 and N39 and gates of the PMOS transistors P32, P34, P36 and P38, and the boosted voltage VPP is supplied to sources of the PMOS transistors P31, P33, P35 and P37 and gates of the NMOS transistors N31, N36 and N38.

The second pre-decoded signals XA and XB, which are outputs from the pre-row-decoder 14, are connected with gates of the NMOS transistors N32 and N33. On the other hand, the control signal is connected with gates of the PMOS transistor P31 and the NMOS transistor N34.

Moreover, the drains of the NMOS transistor N31 and the PMOS transistor P32, the drains of the NMOS transistor N34 and the PMOS transistor P34 and the gates of the NMOS transistor N37 and the PMOS transistor P35 are connected at a node n1; and the drains of the NMOS transistor N36 and the PMOS transistor P36, the gates of the NMOS transistor N39 and the PMOS transistor P37 and the gates of the NMOS transistor N35 and the PMOS transistor P33 are connected at a node n2. The drains of the PMOS transistor P38 and the NMOS transistor N38 (an output from the level shifter 22) are connected with the word-line driver group 24.

In the level shifter 22 having such a configuration, when a high-level potential (e.g., an external power supply potential VDD) having a voltage lower than the boosted voltage VPP is input to the control signal and the second pre-decoded signals XA and XB, the boosted voltage VPP is supplied to the node n2, and an output (the selection signal S1) becomes a ground potential VSS. On the other hand, when a low-level potential is input as the control signal, the boosted potential VPP is supplied to the node n1, and an output (the selection signal S1) becomes the boosted potential VPP.

In FIG. 6, the signal XA supplied as the second pre-decoded signal has data for each memory sub-array block, e.g., four types of data as described above, and the signal XB has 16 types of data in common with the respective memory sub-arrays. By transmitting these two types of signals XA and XB through the AND gates of the NMOS transistors N32 and the N33, one selection signal s1 can be output from 64 types of combinations, and one sub-word-line can be selected through the word-line driver group 24.

Figure 7:
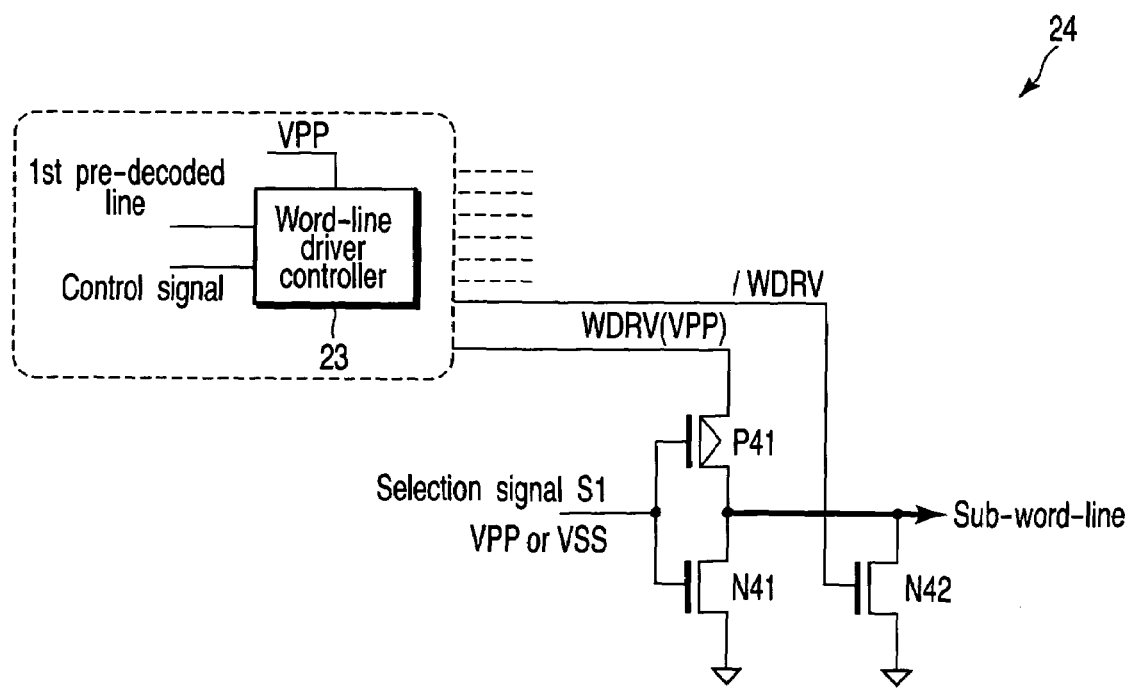
FIG. 7 is a circuit diagram of one unit of a word-line driver group.

FIG. 7 shows an example of a unit driver of the word-line driver group 24. The unit driver of the word-line driver group 24 comprises a PMOS transistor P41 and two NMOS transistors N41 and N42, and these transistors are all connected with eight outputs of the word-line driver controller 23 in parallel. The selection signal s1 which becomes the boosted voltage VPP when not selected and becomes the ground potential VSS when selected is supplied to eight gate pairs of the PMOS transistor P41 and the NMOS transistor N41 of the word-line driver group 24 in parallel by the level shifter 22.

Additionally, a word-line driving signal WDRV which is output through the word-line driver controller 23 based on the signal of the first pre-decoder line and the control signal is input to the source of the PMOS transistor P41, and the boosted potential VPP is supplied when the sub-word-line is supplied, whilst the ground potential VSS level is supplied when the same sub-word-line is not selected. A signal/WDRV which has a logical level opposite to that of the signal WDRV and whose high-level potential is lower than the boosted potential VPP is supplied to the gate of the NMOS transistor N42.

Since the level shifter 22, the word-line driver controller 23 and the word-line driver group 24 are operated with the boosted potential VPP, a film thickness of a gate dielectric film must be made larger than a film thickness of a gate dielectric film of the transistor which operates with the regular power supply potential VDD. Therefore, the semiconductor memory device according to this embodiment is effective when used for a semiconductor device which utilizes a plurality of dielectric film thicknesses.

An operation of the semiconductor memory device in this embodiment will now be described. The control command and the row-address signal input from the outside of the chip are respectively input to the pre-row-decoder 14 through the row-related controller 57 and the row-address buffer 58. The pre-row-decoder 14 generates a control signal based on the control command and the row-address signal input thereto, and activates an arbitrary sub-array block 10 and the first and second pre-decoded lines which are used to select an arbitrary sub-word-line. The word-line level shifter 13 outputs the selection signal s1 boosted to the boosted potential VPP based on the second pre-decoded line.

On the other hand, the signal of the first pre-decoded line is input to each sub-word-line driver 11, and activates a predetermined sub-word-line 19 included in the selected memory sub-array block 10 in response to the selection signal s1 and the control signal output from the sub-word-line level shifter 13.

In the semiconductor memory device in which the sub-word-line level shifter and the sub-word-line driver are arranged in each memory sub-array block in this manner, since the boosted potential VPP is not supplied to the first pre-decoded lines corresponding to the conventional main word-lines, power consumption of VPP can be suppressed. Therefore, the burden on the boosted potential generator 15 or the decoupling capacitor 16 is lightened, thereby reducing the layout area.

As described above, according to this embodiment, in the semiconductor memory device adopting the hierarchical word-line scheme, it is possible to provide a semiconductor memory device which can reduce power losses in the main word-lines and decrease the entire chip area by down-sizing the area required for the internal boosted potential generator or decoupling capacitor.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array in which a plurality of memory cells are arranged in rows and columns and which comprises a plurality of memory sub-array blocks divided in a direction of the rows;
   a plurality of sub-word lines which are provided in each of the plurality of memory sub-array blocks, and extend in the direction of the rows to connect with corresponding ones of the plurality of memory cells;
   a plurality of sub-word-line drivers each of which is provided in each of the plurality of memory sub-array blocks and which drive the plurality of sub-word lines;
   a plurality of sub-word-line level shifters each of which is provided in each of the plurality of memory sub-array blocks and which supply a boosted signal to the plurality of sub-word-line drivers;
   a first pre-decoded line group which extends across the plurality of memory sub-array blocks in the direction of the rows, and is connected with the plurality of sub-word-line drivers;
   a second pre-decoded line group which extends across the plurality of memory sub-array blocks in the direction of the rows, and is connected with the plurality of sub-word-line level shifters; and
   a pre-row-decoder which pre-decodes an address of a selected cell in the plurality of memory cells, and supplies information of a sub-word-line corresponding to a row address of the selected cell in the plurality of sub-word lines to the first pre-decoded line group and the second pre-decoded line group,
   wherein signal voltages of the plurality of sub-word-lines are selectively made higher than signal voltages of the first pre-decoded line group by the plurality of sub-word-line level shifters and the plurality of sub-word-line drivers.

2. The semiconductor memory device according to claim 1, wherein the first pre-decoded line group and the second pre-decoded line group are arranged in the same direction.

3. The semiconductor memory device according to claim 1, wherein the second pre-decoded line group and the plurality of sub-word-lines are arranged in the same direction.

4. The semiconductor memory device according to claim 1, wherein the pre-row-decoder selects a predetermined memory sub-array block from the plurality of memory sub-array blocks through the first pre-decoder line group and the second pre-decoder line group, and selectively activates the plurality of sub-word-lines in the predetermined memory sub-array block through the plurality of sub-word-line level shifters and the plurality of sub-word-line drivers.

5. The semiconductor memory device according to claim 4, wherein each of the sub-word-line level shifters comprises a plurality of unit level shifters, each of the sub-word-line drivers has a plurality of word-line drivers provided in accordance with the plurality of unit level shifters, one of the unit level shifters outputs a driver selection signal which selects a corresponding one of the word-line drivers based on a signal supplied from the pre-row-decoder through the second pre-decoded line group.

6. The semiconductor memory device according to claim 1, wherein one of the plurality of sub-word-lines is selected, when a signal of the second pre-decoded line group selects a row in which one of the plurality of sub-word-lines is included, and a signal of the first pre-decoded line group selects one of the plurality of sub-array blocks.

7. The semiconductor memory device according to claim 1, wherein each of the sub-word-line drivers converts a sub-word-line selection signal selected by the pre-row-decoder and supplied through the first pre-row-decoded line to a high voltage.

8. The semiconductor memory device according to claim 1, wherein each of the sub-word-line level shifters includes a transistor having a gate oxide film thickness larger than a film thickness of a gate dielectric film of a transistor constituting the pre-row-decoder.

9. The semiconductor memory device according to claim 1, wherein each of the sub-word-line drivers includes a transistor having a gate oxide film thickness larger than a film thickness of a gate dielectric film of a transistor constituting the pre-row-decoder.

10. A semiconductor memory device comprising:
a memory cell array in which a plurality of memory cells are arranged in rows and columns and which comprises a plurality of memory sub-array blocks divided in a direction of the rows;
a plurality of sub-word lines which are provided in each of the plurality of memory sub-array blocks, and extend in the direction of the rows to connect with a corresponding one of the plurality of memory cells;
a plurality of sub-word-line drivers each of which is provided in each of the plurality of memory sub-array blocks and which drive the plurality of sub-word lines;
a plurality of sub-word-line level shifters each of which is provided in each of the plurality of memory sub-array blocks and which supply a boosted signal to the plurality of sub-word-line drivers;
a first pre-decoded line group which extends across the plurality of memory sub-array blocks in the direction of the rows, and is connected with the plurality of sub-word-line drivers;
a second pre-decoded line group which extends across the plurality of memory sub-array blocks in the direction of the rows, and is connected with the plurality of sub-word-line level shifters;
a pre-low-decoder which pre-decodes an address of a selected cell in the plurality of memory cells, and supplies information of a sub-word-line corresponding to a row address of the selected cell in the plurality of sub-word lines to the first pre-decoded line group and the second pre-decoded line group;
an internal boosted power supply generator which supplies a boosted potential to the sub-word-line drivers and the sub-word-line level shifters; and
a decoupling capacitor which stabilizes the boosted potential,
wherein signal voltages of the plurality of sub-word-lines are selectively made higher than signal voltages of the first pre-decoded line group by the plurality of sub-word-line level shifters and the plurality of sub-word-line drivers.

11. The semiconductor memory device according to claim 10, wherein the first pre-decoded line group and the second pre-decoded line group are arranged in the same direction.

12. The semiconductor memory device according to claim 10, wherein the second pre-decoded line group and the plurality of sub-word-lines are arranged in the same direction.

13. The semiconductor memory device according to claim 10, wherein the pre-row-decoder selects a predetermined sub-array block from the plurality of sub-array blocks through the first pre-decoder line group and the second pre-decoder line group, and selectively activates the plurality of sub-word-lines in the predetermined sub-array block through the plurality of sub-word-line level shifters and the plurality of sub-word-line drivers.

14. The semiconductor memory device according to claim 13, wherein each of the sub-word-line level shifters comprises a plurality of unit level shifters, each of the sub-word-line drivers has a plurality of word-line drivers provided in accordance with the plurality of unit level shifters, one of the unit level shifters outputs a driver selection signal which selects a corresponding one of the word-line drivers based on a signal supplied from the pre-row-decoder through the second pre-decoded line group.

15. The semiconductor memory device according to claim 10, wherein one of the plurality of sub-word-lines is selected, when a signal of the second pre-decoded line group selects a row in which one of the plurality of sub-word-lines is included, and a signal of the first pre-decoded line group selects one of the plurality of sub-array blocks.

16. The semiconductor memory device according to claim 10, wherein each of the sub-word-line drivers converts a sub-word-line selection signal selected by the pre-row-decoder and supplied through the first pre-row-decoded line to a high voltage.

17. The semiconductor memory device according to claim 10, wherein each of the sub-word-line level shifters includes a transistor having a gate oxide film thickness larger than a film thickness of a gate dielectric film of a transistor constituting the pre-row-decoder.

18. The semiconductor memory device according to claim 10, wherein each of the sub-word-line drivers includes a transistor having a gate oxide film thickness larger than a film thickness of a gate dielectric film of a transistor constituting the pre-row-decoder.

* * * * *